United States Patent
Kim et al.

(10) Patent No.: US 7,289,380 B2
(45) Date of Patent: Oct. 30, 2007

(54) SEMICONDUCTOR MEMORY DEVICES INCORPORATING VOLTAGE LEVEL SHIFTERS FOR CONTROLLING A VPP VOLTAGE LEVEL INDEPENDENTLY AND METHODS OF OPERATING THE SAME

(75) Inventors: Dong-jun Kim, Gyeonggi-do (KR); Hee-joo Choi, Gyeonggi-do (KR); Kae-won Ha, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/243,428

(22) Filed: Oct. 4, 2005

(65) Prior Publication Data

US 2006/0104134 A1 May 18, 2006

(30) Foreign Application Priority Data

Oct. 4, 2004 (KR) ............... 10-2004-0078695

(51) Int. Cl.
*G11C 29/00* (2006.01)
(52) U.S. Cl. ............... 365/201; 365/226; 365/189.09
(58) Field of Classification Search ............ 365/201, 365/226, 189.07, 189.09, 189.11
See application file for complete search history.

(56) References Cited

U.S. PATENT DOCUMENTS 6,498,760 B2 * 12/2002 Yamasaki ............ 365/226
6,549,480 B2 *  4/2003 Hosogane et al. ...... 365/226
6,661,729 B2 * 12/2003 Yamasaki ............ 365/226

FOREIGN PATENT DOCUMENTS

| JP | 7225262       | 8/1995  |
| JP | 2002197896    | 7/2002  |
| JP | 2003329735    | 11/2003 |
| KR | 100224670 B1  | 7/1999  |
| KR | 1020030058389 A | 7/2003 |

* cited by examiner

*Primary Examiner*—Gene N. Auduong
(74) *Attorney, Agent, or Firm*—Myers Bigel Sibley & Sajovec

(57) ABSTRACT

A voltage level shifter for a semiconductor memory device includes a VPP level control circuit that is configured to detect a VPP voltage and to change the VPP voltage in response to a package burn-in mode signal and a test mode signal independent of at least one direct current voltage generated in response to the package burn-in mode signal.

21 Claims, 5 Drawing Sheets

SEMICONDUCTOR MEMORY DEVICES INCORPORATING VOLTAGE LEVEL SHIFTERS FOR CONTROLLING A VPP VOLTAGE LEVEL INDEPENDENTLY AND METHODS OF OPERATING THE SAME

RELATED APPLICATION

This application claims the benefit of and priority to Korean Patent Application No. 10-2004-0078695, filed on Oct. 4, 2004, in the Korean Intellectual Property Office (KIPO), the disclosure of which is hereby incorporated herein by reference.

BACKGROUND OF THE INVENTION

1. Field of the Invention

The present invention relates to semiconductor memory devices, and, more particularly, to circuits for controlling a voltage power peak (VPP) level, which is a high voltage used in a semiconductor memory device.

2. Description of the Related Art

Because the VPP voltage of semiconductor devices, such as memory devices, is typically higher than an external voltage source (VDD), the VPP voltage may compensate for a loss of threshold voltage in transistors. In this regard, the VPP voltage is commonly used in semiconductor devices. In particular, the VPP voltage is often used in memory devices as a wordline voltage.

A VPP voltage level may be determined by the amount of electric charge of a VPP capacitor. Electric charge of a VPP capacitor may be lost by minute reverse bias leakage current flowing in a PN junction of the VPP capacitor and by a large transient current used to drive circuits within semiconductor memory chips whenever the semiconductor memory chips are activated. Thus, the VPP voltage level may not be consistently maintained unless such a loss of electric charge is compensated for.

To maintain a relatively consistent VPP voltage level, a semiconductor device may use a VPP voltage level detector. If the VPP voltage is lowered due to the leakage of electric charge, the VPP voltage level detector may detect the lowered VPP voltage and turn on an oscillator to raise the level of the lowered VPP voltage. Then, the VPP voltage level detector may detect the level of the VPP voltage again. If the VPP voltage has been raised to a desired level, then the VPP voltage level detector turns off the oscillator.

The oscillator is activated by a package burn-in mode information (PBI) signal and changed linearly according to the VDD voltage. The PBI signal may use a test mode when the semiconductor device is in a burn-in mode.

FIG. 1 is a block diagram that illustrates a conventional voltage level shifter. The voltage level shifter is configured such that the PBI signal can be input to a VPP detection circuit 11, a VPP generation circuit 12, a Vrefa generation circuit 13, and a Vp/VBLP generation circuit 14. Here, the Vrefa voltage is a reference voltage for semiconductor memory cells, the Vp voltage is a plate voltage of the semiconductor memory cells, and the VBLP voltage is a pre-charge voltage of a bitline of a semiconductor memory. The voltage level shifter is activated by the PBI signal and controls a VPP voltage level based on test-mode register bit information.

FIG. 2 is a schematic that illustrates a conventional VPP level control circuit, which controls a VPP voltage level using mode register bit information. When in a test mode, a semiconductor device enters a mode register setting mode and sets corresponding bits such that the VPP voltage can be adjusted to a desired level. The set bits are input to first through $n^{th}$ MOS transistors MT1 through MTn as zero'th through $(n-1)^{th}$ control bits M0 through Mn-1, thus controlling the VPP voltage level.

For example, if the zero'th through $(n-1)^{th}$ control bits M0 through Mn-1 are 1000 through 0, then a Y amount of current can be made to flow. If the zero'th through $(n-1)^{th}$ control bits M0 through Mn-1 are 0100 through 0, then a 2Y amount of current can be made to flow. If the zero'th through $(n-1)^{th}$ control bits M0 through Mn-1 are 1100 through 0, then a 3Y amount of current can be made to flow. In other words, the VPP voltage level can be adjusted by controlling the amount of current. In this case, if the first through $n^{th}$ MOS transistors MT1 through MTn have different sizes, $2^n$ types of VPP voltage levels can be set.

It is determined whether the semiconductor memory cells are defective using data of a predetermined pattern.

The VPP level control circuit of the semiconductor memory device can adjust the VPP voltage level by controlling the VDD voltage. However, if the VDD voltage changes, then so do levels of other DC voltages (Vrefa, Vp, VBLP, etc.) as well as the VPP voltage level. Changes in the levels of such voltages are illustrated in FIG. 3.

FIG. 3 is a graph illustrating the variation in levels of voltages controlled by a conventional voltage level control circuit. As the VDD voltage changes, not only the VPP voltage level but also the levels of other DC voltages, such as Vrefa, Vp, and VBLP, change accordingly. In this case, if the VDD voltage changes to raise the level of the VPP voltage, the levels of other voltages may also be affected and changed accordingly. Hence it may not be possible to control the VPP voltage level independently of the levels of other voltages using the VDD voltage.

SUMMARY OF THE INVENTION

In some embodiments of the present invention, a voltage level shifter for a semiconductor memory device includes a VPP level control circuit that is configured to detect a VPP voltage and to change the VPP voltage in response to a package burn-in mode signal and a test mode signal independent of at least one direct current voltage generated in response to the package burn-in mode signal.

In other embodiments of the present invention, the VPP level control circuit is further configured to change the VPP voltage linearly responsive to the package burn-in mode signal and the test mode signal.

In still other embodiments of the present invention, the voltage level shifter further includes a reference voltage generation circuit is configured to change a reference voltage of a semiconductor memory cell in response to the package burn-in mode signal and a bitline voltage generation circuit that is configured to change a bitline voltage of the semiconductor memory cell in response to the package burn-in mode signal. The at least one direct current voltage comprises the reference voltage and the bitline voltage.

In still other embodiments of the present invention, the VPP level control circuit includes a VPP voltage level detection circuit that is configured to generate a VPP voltage detection signal responsive to the VPP voltage level, and a VPP generation circuit that is configured to change the VPP voltage level so as to be based on a predetermined mode register setting mode or a VDD voltage in response to the VPP voltage detection signal.

In still other embodiments of the present invention, if activated by the package burn-in mode signal, the VPP level control circuit sets the VPP voltage level to be based on a predetermined mode register setting mode, and if activated by the test mode signal, the VPP level control circuit sets the VPP voltage level to be based on a VDD voltage.

In still other embodiments of the present invention, if activated by the test mode signal, the VPP level control circuit controls the VPP voltage level so as to change linearly based on the VDD voltage.

In still other embodiments of the present invention, if activated by the package burn-in mode signal or the test mode signal, the VPP level control circuit controls the VPP voltage level so as to change linearly based on the VDD voltage.

In still other embodiments of the present invention, the VPP level control circuit further comprises an OR gate that is configured to receive and to logically OR the package burn-in mode signal and the test mode signal, to detect a VPP voltage level responsive to an output signal from the OR gate, and to generate a VPP voltage detection signal responsive to the detected VPP voltage level.

Although described above primarily with respect to embodiments of a voltage level shifter for a semiconductor memory device, it will be understood that the present invention is not limited thereto and may also be embodied, for example, as semiconductor memory devices and methods of operating voltage level shifters and/or semiconductor memory devices.

BRIEF DESCRIPTION OF THE DRAWINGS

The above and other features and advantages of the present invention will become more apparent by describing in detail example embodiments thereof with reference to the accompanying drawings, in which.

DETAILED DESCRIPTION OF EMBODIMENTS

Figure 1:
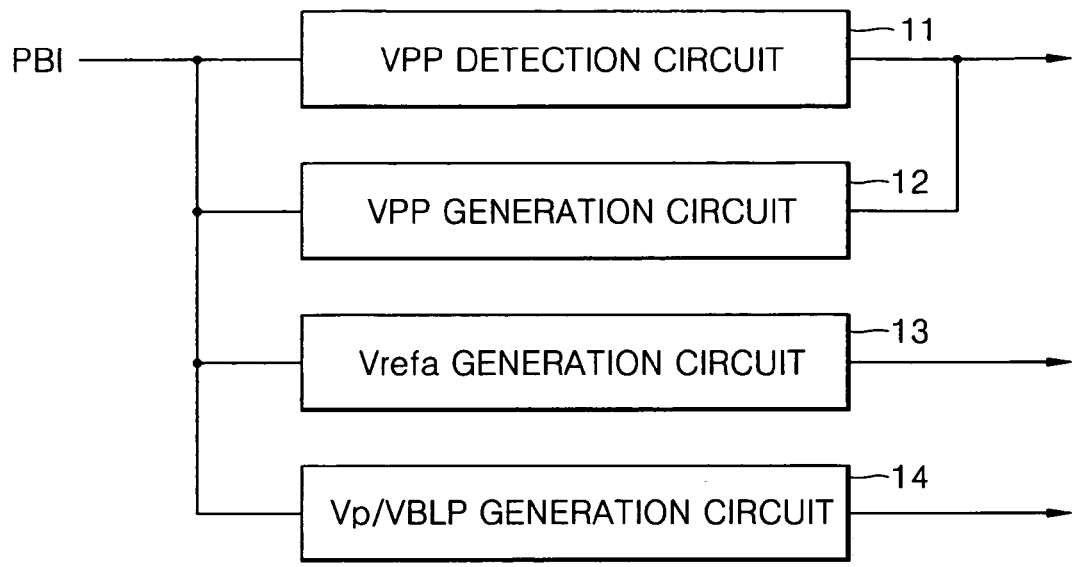
FIG. 1 illustrates a block diagram of a conventional voltage level shifter.
Figure 2:
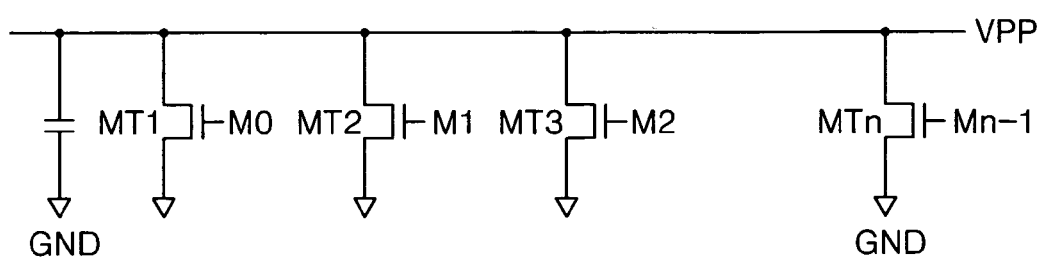
FIG. 2 is a schematic that illustrates a conventional VPP level control circuit.
Figure 3:
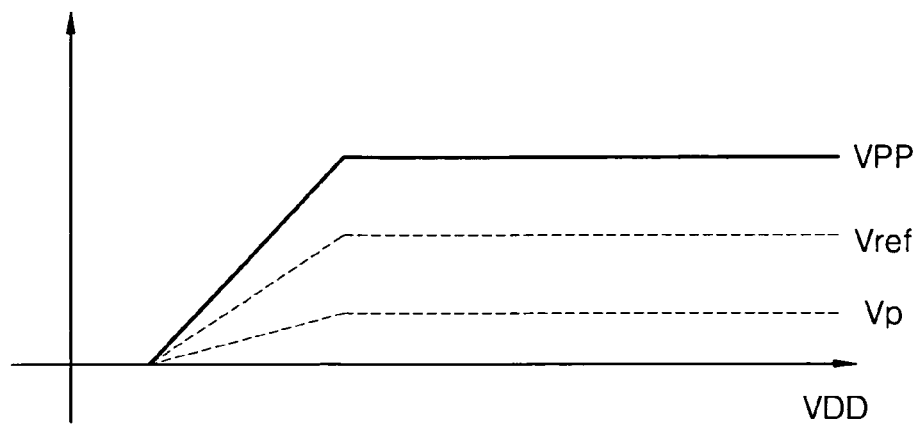
FIG. 3 is a graph illustrating the variation in levels of voltages controlled by a conventional voltage level control circuit.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout the description.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
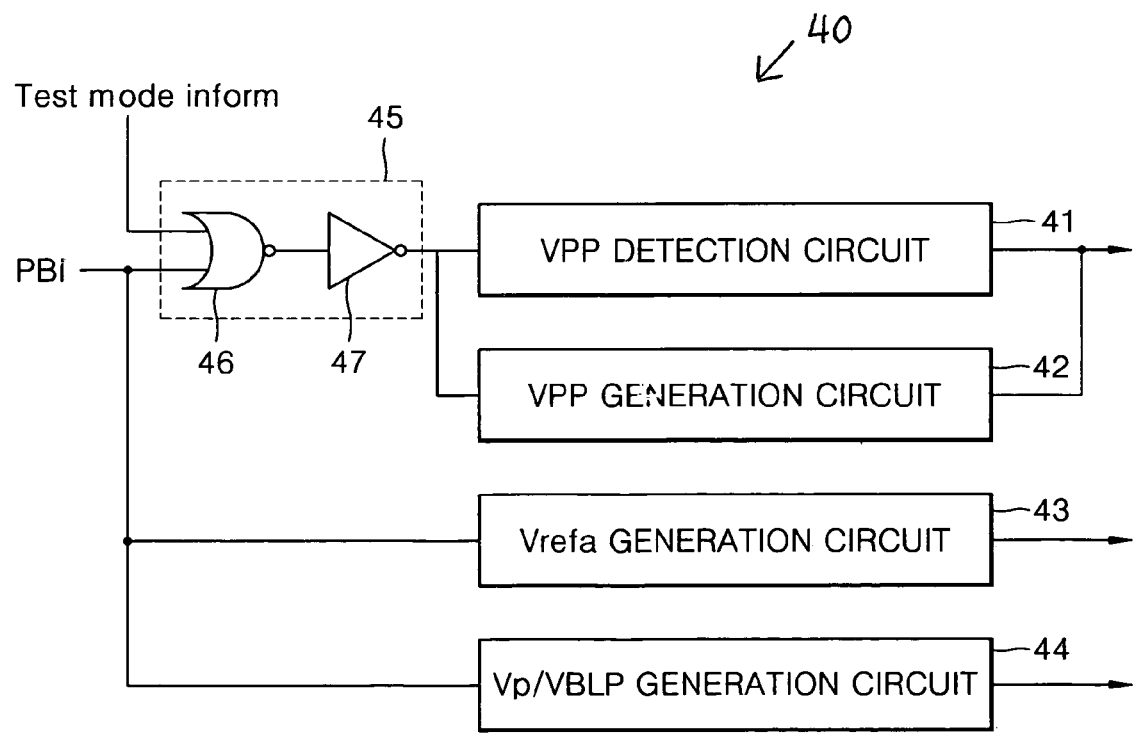
FIG. 4 is a schematic that illustrates a voltage level shifter in accordance with some embodiments of the present invention.

FIG. 4 is a schematic that illustrates a voltage level shifter 40 in accordance with some embodiments of the present invention. The voltage level shifter 40 includes a VPP detection circuit 41, a VPP generation circuit 42, a Vrefa generation circuit 43, a Vp/VBLP generation circuit 44, and an OR gate 45. The OR gate 45 may include a NOR gate 46 and an inverter 47 for the convenience of circuit configuration.

The OR gate 45 receives and ORs a package burn-in mode information (PBI) signal and a test mode inform signal and outputs the result of the OR operation to the VPP detection circuit 41 and the VPP generation circuit 42. In a normal mode, the VPP detection circuit 41 detects a VPP voltage level to maintain a predetermined VPP voltage level and generates a VPP voltage detection signal. The VPP generation circuit 42 adjusts the VPP voltage level according to a test mode register setting signal (TMRS) in response to the VPP voltage detection signal.

In addition, in response to the VPP voltage generation signal, the VPP generation circuit 42 adjusts the VPP voltage level to be linearly changed according the VDD voltage level controlled externally. The Vrefa generation circuit 43 and the Vp/VBLP generation circuit 44 are activated by the PBI signal and adjust voltage levels using the TMRS and the VDD voltage.

Referring to FIG. 4, the VPP detection circuit 41 and the VPP generation circuit 42 are activated by the PBI signal or the test mode inform signal while the Vrefa generation circuit 43 and the Vp/VBLP generation circuit are activated by only the PBI signal. Hence, the VPP voltage level can be adjusted independently of levels of other voltages by generating only the test mode inform signal. In other words, when only the VPP voltage level is to be changed using the VDD voltage, only the VPP detection circuit 41 and the VPP generation circuit are activated to be in a test mode using the test mode inform signal while generation circuits of other voltages operate in the normal mode. Thus, only the VPP voltage level is controlled by changing the VDD voltage.

Table 1 below illustrates how a VPP level shifter, which comprises the VPP detection circuit 41 and the VPP generation circuit 42, is enabled by the test mode inform signal and the PBI signal.

TABLE 1

| PBI | Test mode inform | VDD | VPP level control |
|---|---|---|---|
| 0 | 0 | Don't care | VPP voltage level is not controlled by the VDD voltage (normal operation) |
| 0 | 1 | VDD ↑ | VPP level shifter is enabled (VPP voltage level is controlled by changing the VDD voltage) |
| 1 | 0 | VDD ↑ | VPP voltage level is controlled by PBI signal |
| 1 | 1 | VDD ↑ | VPP voltage level is controlled by PBI signal |

Referring to Table 1, if the PBI signal and the test mode inform signal are logic low, the VPP level shifter operates in the normal mode. Thus, the VPP level shifter operates such that the VPP voltage can be maintained at a predetermined level. In this case, the VPP voltage level is not adjusted or controlled by changing the VDD.

If the test mode inform signal is logic high and the PBI signal is logic low, only the VPP detection circuit 41 and the VPP generation circuit 42 are enabled to be in the test mode as illustrated in FIG. 4. Thus, the VPP voltage level can be adjusted or controlled by changing the VDD voltage. That is, without affecting the level of Vrefa, Vp, or VBLP, the VPP voltage level can be controlled by changing the VDD voltage. In this case, the Vrefa generation circuit 43 and Vp/VBLP generation circuit 44 operate in the normal mode and maintain respective voltages at predetermined levels without being adjusted based on the VDD voltage.

If the PBI signal is logic high, the VPP detection circuit 41, the VPP generation circuit 42, the Vrefa generation circuit 43, and the Vp/VBLP generation circuit 44 are enabled to be in the test mode and control the levels of respective voltages according to a predetermined mode register setting mode. In other words, if the PBI signal is logic high, the VPP detection circuit 41, the VPP generation circuit 42, the Vrefa generation circuit 43, and the Vp/VBLP generation circuit 44 operate in the same way as in a conventional method of controlling a VPP voltage level in the test mode. If the VPP generation circuit 42 is activated by the PBI signal, then the VPP generation circuit 42 can adjust the VPP voltage level according to the predetermined mode register setting mode or the VDD voltage.

Figure 5:
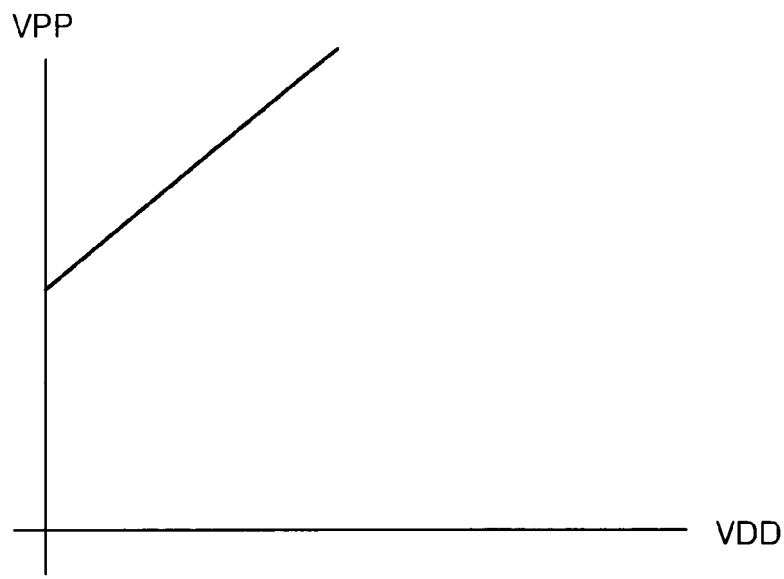
FIG. 5 is a graph illustrating the change in the VPP voltage level with respect to the change in the VDD voltage level according to some embodiments of the present invention.

FIG. 5 is a graph illustrating the change in the VPP voltage level with respect to the change in the VDD voltage level according to some embodiments of the present invention. Referring to FIG. 5, the VPP voltage level can be linearly changed by controlling the VDD voltage level. The slope of the graph shown in FIG. 5 may be set to a predetermined value and implemented accordingly when designing the semiconductor memory device.

Figure 6:
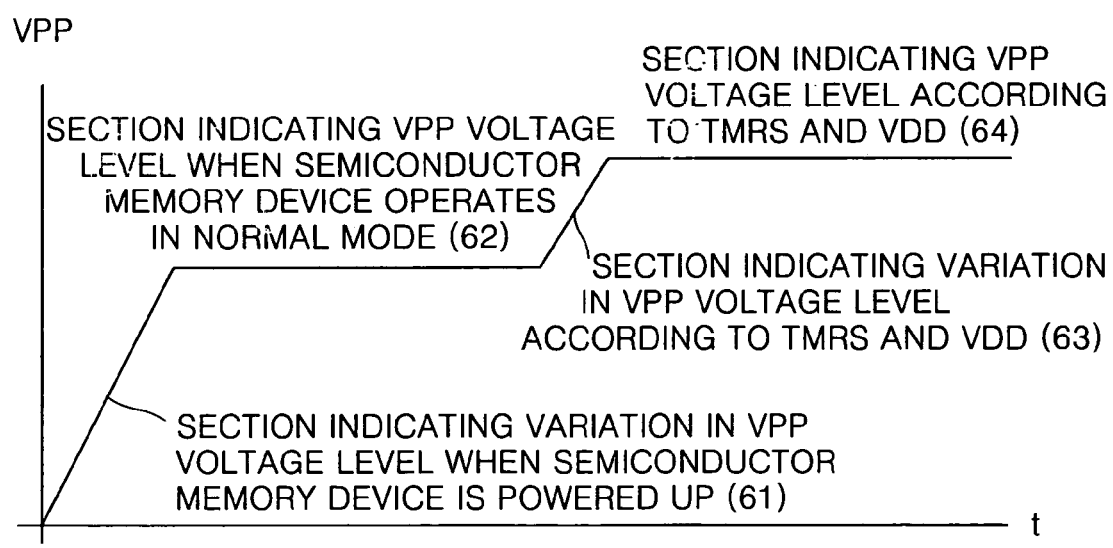
FIG. 6 is a graph illustrating the VPP voltage level controlled by the voltage level shifter according to some embodiments of the present invention.

FIG. 6 is a graph illustrating the VPP voltage level controlled by the voltage level shifter 40 according to some embodiments of the present invention. Section 61 indicates the variation in the VPP voltage level when the semiconductor memory device is powered up. When the semiconductor memory device is powered up, the VPP voltage rises from zero to a predetermined level through pumping.

Section 62 indicates the VPP voltage level when the semiconductor memory device operates in the normal mode. When the semiconductor memory device operates in the normal mode, the voltage level shifter 40 controls the VPP detection circuit 41 and the VPP generation circuit 42 to detect the VPP voltage level and turn on an oscillator in case of leakage of electric charge to maintain a consistent VPP voltage level.

Section 63 indicates the variation in the VPP voltage level according to the TMRS in response to the PBI signal or according to the VDD voltage in response to the test mode inform signal. Section 64 indicates the VPP voltage level newly set by the TMRS or the VDD level.

The VPP detection circuit 41 detects the VPP voltage level and generates the VPP voltage detection signal. In other words, if the VPP voltage level is lower or higher than a predetermined level, the VPP voltage detection signal is either enabled or disabled, thereby controlling the VPP generation circuit 42.

The VPP generation circuit 42 changes the VPP voltage level according to a predetermined mode register setting bit or the VDD voltage in response to the VPP voltage detection signal. For example, while the VPP voltage detection signal is enabled, the VPP generation circuit 42 turns on the oscillator to change or maintain the VPP voltage level according to the predetermined mode register setting bit or the VDD voltage. If the VPP voltage detection signal is disabled, the VPP generation circuit 42 turns off the oscillator to stop supplying VPP electric charge.

Figure 7:
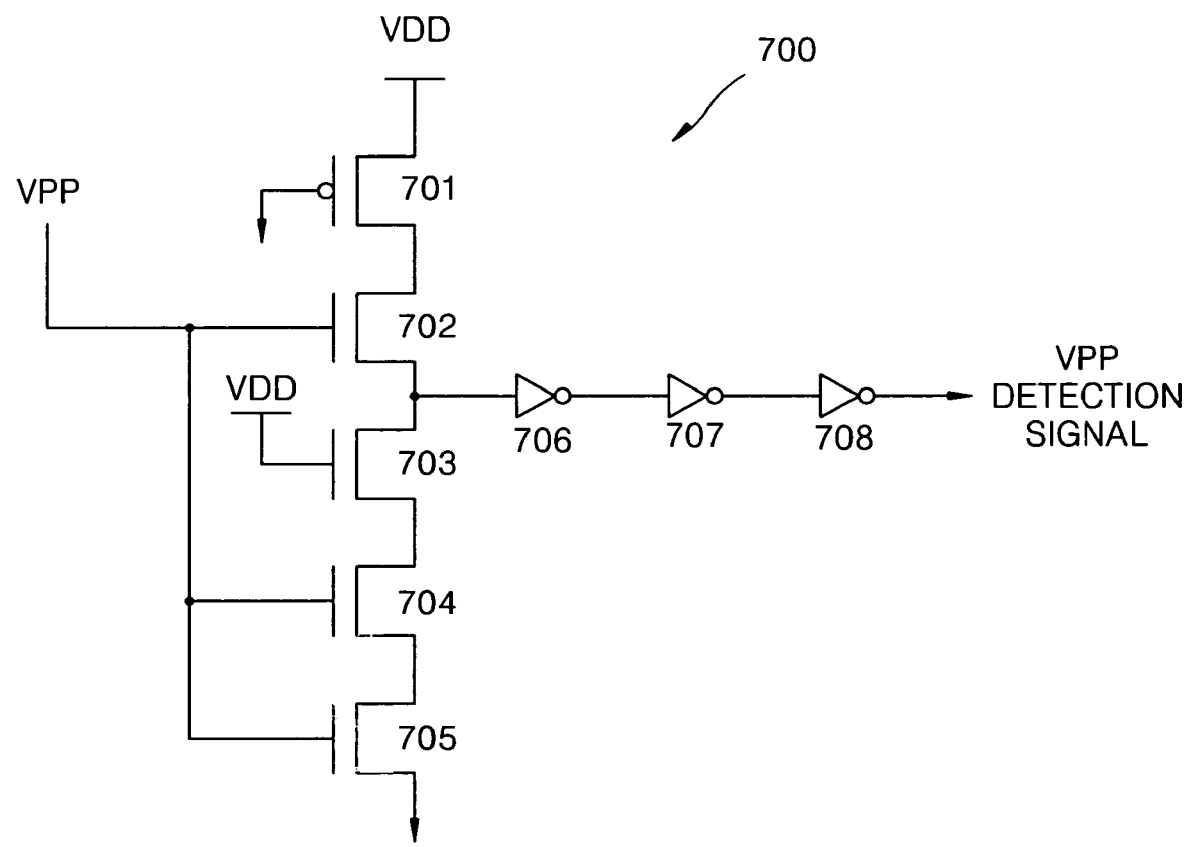
FIG. 7 illustrates a VPP detection circuit according to some embodiments of the present invention.

FIG. 7 illustrates a VPP detection circuit 700 according to some embodiments of the present invention. The VPP detection circuit 700 includes a PMOS transistor 701, a first NMOS transistor 702, a second NMOS transistor 703, a third NMOS transistor 704, a fourth NMOS transistor 705, and three inverters 706 through 708.

The PMOS transistor 701 has a gate connected to ground or a common potential, a terminal connected to a VDD voltage source, and another terminal connected to a first NMOS transistor 702. The first NMOS transistor 702 has a gate connected to a VPP voltage source, a terminal connected to the PMOS transistor 701, and another transistor connected to the second NMOS transistor 703. The second NMOS transistor 703 has a gate connected to the VDD voltage source, a terminal connected to the first NMOS transistor 702, and another terminal connected to the third NMOS transistor 704. The third NMOS transistor 704 has a gate connected to the VPP voltage source, a terminal connected to the second NMOS transistor 703, and another terminal connected to the fourth NMOS transistor 705. The fourth NMOS transistor 705 has a gate connected to the VPP voltage source, a terminal connected to the third NMOS transistor 704, and another terminal connected to ground.

The three inverters 706 through 708 are connected to a point of contact between the first and second NMOS transistors 702 and 703. The VPP voltage detection signal is output from the inverter 708.

Figure 8:
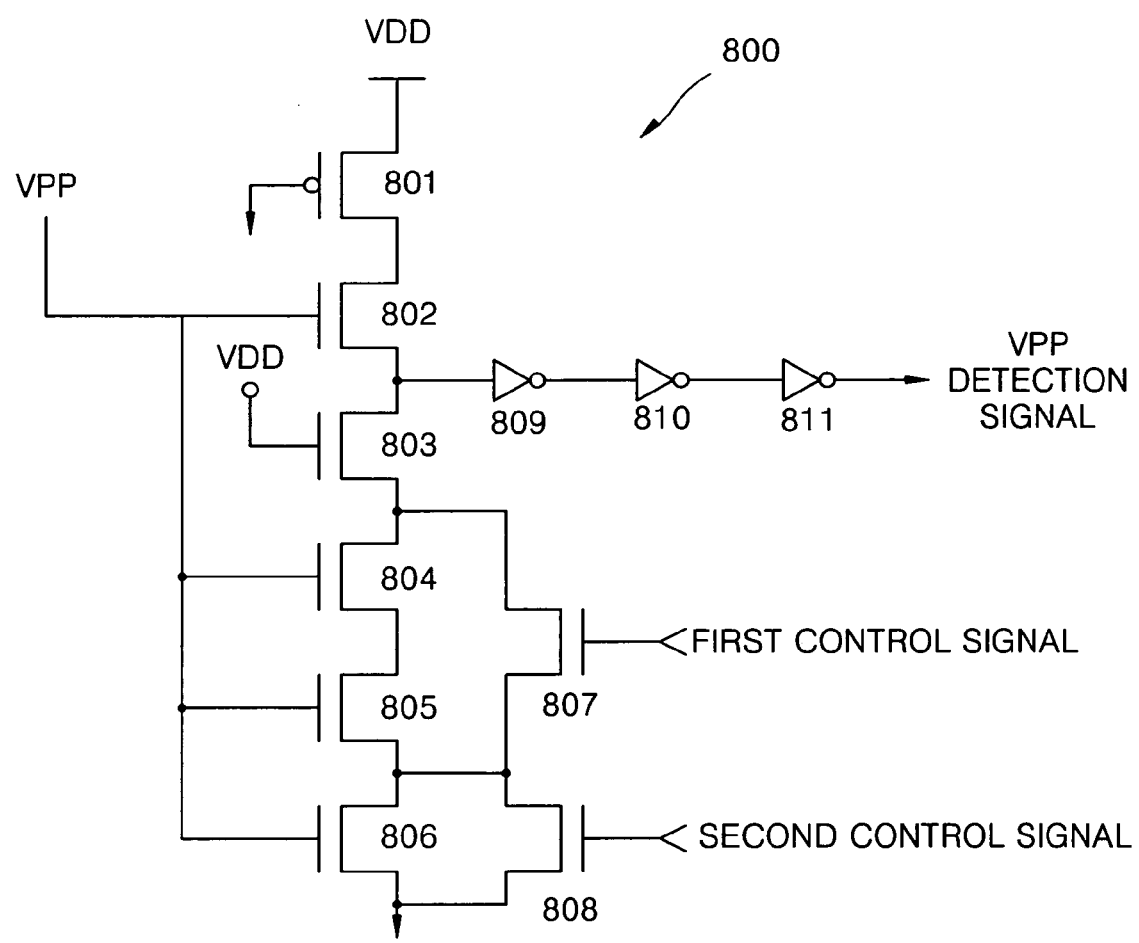
FIG. 8 illustrates a VPP detection circuit according to further embodiments of the present invention.

FIG. 8 illustrates a VPP detection circuit 800 according to further embodiments of the present invention. The VPP detection circuit 800 includes a PMOS transistor 801, a first NMOS transistor 802, a second NMOS transistor 803, a third NMOS transistor 804, a fourth NMOS transistor 805, a fifth NMOS transistor 806, a sixth NMOS transistor 807, a seventh NMOS transistor 808, and three inverters 809 through 810.

The PMOS transistor 801 has a gate connected to ground or a common potential, a terminal connected to a VDD voltage source, and another terminal connected to a first NMOS transistor 802. The first NMOS transistor 802 has a gate connected to a VPP voltage source, a terminal connected to the PMOS transistor 801, and another transistor connected to the second NMOS transistor 803. The second NMOS transistor 803 has a gate connected to the VDD voltage source, a terminal connected to the first NMOS transistor 802, and another terminal connected to the third NMOS transistor 804. The third NMOS transistor 804 has a gate connected to the VPP voltage source, a terminal connected to the second NMOS transistor 803, and another terminal connected to the fourth NMOS transistor 805. The fourth NMOS transistor 805 has a gate connected to the VPP voltage source, a terminal connected to the third NMOS transistor 804, and another terminal connected to the fifth NMOS transistor 806.

The fifth NMOS transistor 806 has a gate connected to the VPP voltage source, a terminal connected to the fourth NMOS transistor 805, and another terminal connected to ground. The sixth NMOS transistor 807 has a gate that receives a first control signal generated by predetermined control bits, a terminal connected to a point of contact between the second and third NMOS transistors 803 and 804, and another terminal connected to a point of contact between the fourth and fifth NMOS transistors 805 and 806. The seventh NMOS transistor 808 has a gate that receives a second control signal generated by predetermined control bits, a terminal connected to a point of contact between the fourth and fifth NMOS transistors 805 and 806, and another terminal connected to ground.

The three inverters 809 through 810 are connected to a point of contact between the first and second NMOS transistors 802 and 803. An output of the inverter 810 is the VPP voltage detection signal.

The VPP detection circuit 800 can set different enabling and disabling timings for the VPP voltage detection signal according to the first and second control signals. For example, the first and second control signals, which are generated by the TMRS, can be set according to particular timing or voltage levels of a particular address.

Therefore, in the normal mode, the VPP detection circuit 800 operates according to a preset target voltage level. In a particular mode such as the package burn-in mode, the first or second control signal is set by the TMRS and input to the VPP detection circuit 800, thereby changing the VPP voltage level. Thus, the VPP voltage level detected by the VPP detection circuit 800 is not the VPP voltage level in the normal mode, but the VPP voltage level changed by the first or second control signal.

Detailed descriptions of the VPP detection circuits 700 and 800 of FIGS. 7 and 8 can be found in Korean Patent No. 10-224670 filed by the present applicant.

A voltage level shifter of a semiconductor memory device according to some embodiments of the present invention can control a VPP voltage level independently of levels of other voltages using a test mode inform signal. In addition, by changing a VDD voltage level, the voltage level shifter can adjust only the VPP voltage to a desired level without changing the levels of other voltages.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A voltage level shifter for a semiconductor memory device,
   comprising:
   a VPP level control circuit that is configured to detect a VPP voltage level and to change the VPP voltage in response to a package burn-in mode signal and a test mode signal independent of at least one direct current voltage generated in response to the package burn-in mode signal.

2. The voltage level shifter of claim 1, wherein the VPP level control circuit is further configured to change the VPP voltage linearly responsive to the package burn-in mode signal and the test mode signal.

3. The voltage level shifter of claim 1, further comprising:
   a reference voltage generation circuit that is configured to change a reference voltage of a semiconductor memory cell in response to the package burn-in mode signal; and
   a bitline voltage generation circuit that is configured to change a bitline voltage of the semiconductor memory cell in response to the package burn-in mode signal;
   wherein the at least one direct current voltage comprises the reference voltage and the bitline voltage.

4. The voltage level shifter of claim 1, wherein the VPP level control circuit comprises:
   a VPP voltage level detection circuit that is configured to generate a VPP voltage detection signal responsive to the VPP voltage level; and
   a VPP generation circuit that is configured to change the VPP voltage level so as to be based on a predetermined mode register setting or a VDD voltage in response to the VPP voltage detection signal.

5. The voltage level shifter of claim 4, wherein the VPP voltage level detection circuit comprises:
   a PMOS transistor having a gate connected to a common voltage, a terminal connected to the VDD voltage, and another terminal connected to a first NMOS transistor;
   the first NMOS transistor having a gate connected to the VPP voltage, a terminal connected to the PMOS transistor, and another terminal connected to a second NMOS transistor;
   the second NMOS transistor having a gate connected to the VDD voltage, a terminal connected to the first NMOS transistor, and another terminal connected to a third NMOS transistor;
   the third NMOS transistor having a gate connected to the VPP voltage, a terminal connected to the second NMOS transistor, and another terminal connected to a fourth NMOS transistor;

the fourth NMOS transistor having a gate connected to the VPP voltage, a terminal connected to the third NMOS transistor, and another terminal connected to the common voltage; and three inverters connected in series to a point of contact between the first and second NMOS transistors;

wherein the VPP voltage detection signal is output from the three inverters.

6. The voltage level shifter of claim 4, wherein the VPP voltage level detection circuit comprises:

a PMOS transistor having a gate connected to a common voltage, a terminal connected to the VDD voltage, and another terminal connected to a first NMOS transistor;

the first NMOS transistor having a gate connected to the VPP voltage, a terminal connected to the PMOS transistor, and another terminal connected to a second NMOS transistor;

the second NMOS transistor having a gate connected to the VDD voltage, a terminal connected to the first NMOS transistor, and another terminal connected to a third NMOS transistor;

the third NMOS transistor having a gate connected to the VPP voltage, a terminal connected to the second NMOS transistor, and another terminal connected to a fourth NMOS transistor;

the fourth NMOS transistor having a gate connected to the VPP voltage, a terminal connected to the third NMOS transistor, and another terminal connected to a fifth NMOS transistor;

the fifth NMOS transistor having a gate connected to the VPP voltage, a terminal connected to the fourth NMOS transistor, and another terminal connected to the common voltage;

a sixth NMOS transistor having a gate that is configured to receive a first control signal generated responsive to the predetermined mode register setting, a terminal connected to a point of contact between the second and third NMOS transistors, and another terminal connected to a point of contact between the fourth and fifth NMOS transistors;

a seventh NMOS transistor having a gate that is configured to receive a second control signal generated responsive to the predetermined mode register setting, a terminal connected to the point of contact between the fourth and fifth NMOS transistors, and another terminal connected to the common voltage; and three inverters connected in series to the point of contact between the first and second NMOS transistors;

wherein the VPP voltage detection signal is output from the three inverters and the VPP voltage level detection circuit is configured to set different enable and disable timings for the VPP voltage detection signal based on the first and second control signals.

7. The voltage level shifter of claim 1, wherein if activated by the package burn-in mode signal, the VPP level control circuit sets the VPP voltage level to be based on a predetermined mode register setting, and if activated by the test mode signal, the VPP level control circuit sets the VPP voltage level to be based on a VDD voltage.

8. The voltage level shifter of claim 7, wherein, if activated by the test mode signal, the VPP level control circuit controls the VPP voltage level so as to change linearly based on the VDD voltage.

9. The voltage level shifter of claim 1, wherein if activated by the package burn-in mode signal or the test mode signal, the VPP level control circuit controls the VPP voltage level so as to change linearly based on the VDD voltage.

10. The voltage level shifter of claim 1, wherein the VPP level control circuit further comprises an OR gate that is configured to receive and to logically OR the package burn-in mode signal and the test mode signal, to detect a VPP voltage level responsive to an output signal from the OR gate, and to generate a VPP voltage detection signal responsive to the detected VPP voltage level.

11. A semiconductor memory device comprising:

an OR gate that is configured to receive and to logically OR a package burn-in mode signal and a test mode signal;

a VPP voltage level detection circuit that is configured to generate a VPP voltage detection signal responsive to an output signal of the OR gate; and a VPP generation circuit that is configured to change the VPP voltage level so as to be based on a predetermined mode register setting or a VDD voltage in response to the VPP voltage detection signal.

12. The memory device of claim 11, wherein if activated by the package burn-in mode signal, the VPP generation circuit sets the VPP voltage level to be based on a predetermined mode register setting, and if activated by the test mode signal, the VPP generation circuit sets the VPP voltage level to be based on a VDD voltage.

13. The memory device of claim 12, wherein, if activated by the test mode signal, the VPP generation circuit controls the VPP voltage level so as to change linearly based on the VDD voltage.

14. The memory device of claim 11, wherein the VPP generation circuit controls the VPP voltage level so as to change linearly based on the VDD voltage.

15. The memory device of claim 11, wherein the VPP generation circuit controls the VPP voltage level so as to be based on a predetermined mode register setting.

16. The memory device of claim 11, further comprising:

voltage generation circuits that are not responsive to the test mode signal.

17. A method of operating a voltage level shifter for a semiconductor memory device, comprising:

detecting a VPP voltage level;

generating at least one direct current voltage in response to a package burn-in mode signal; and changing the VPP voltage in response to the package burn-in mode signal and a test mode signal independent of generating the at least one direct current voltage.

18. The method of claim 17, further comprising:

changing the VPP voltage linearly responsive to the package burn-in mode signal and the test mode signal.

19. A method of operating a semiconductor memory device, comprising:

performing a logical OR operation on a package burn-in mode signal and a test mode signal;

generating a VPP voltage detection signal responsive to an output signal of the OR gate; and changing the VPP voltage level so as to be based on a predetermined mode register setting or a VDD voltage responsive to the VPP voltage detection signal.

20. The method of claim 19, wherein changing the VPP voltage level comprises changing the VPP voltage level linearly based on the VDD voltage.

21. The method of claim 19, wherein changing the VPP voltage level comprises controlling the VPP voltage level so as to be based on a predetermined mode register setting.

* * * * *

UNITED STATES PATENT AND TRADEMARK OFFICE
CERTIFICATE OF CORRECTION

PATENT NO. : 7,289,380 B2 Page 1 of 1
APPLICATION NO. : 11/243428
DATED : October 30, 2007
INVENTOR(S) : Kim et al.

It is certified that error appears in the above-identified patent and that said Letters Patent is hereby corrected as shown below:

Column 8, Claim 1, Line 22; Delete "bum-in mode" Enter --burn-in mode--.
Column 8, Claim 2, Line 28; Delete "bum-in mode" Enter --burn-in mode--.
Column 8, Claim 3, Line 33; Delete "bum-in mode" Enter --burn-in mode--.
Column 8, Claim 3, Line 37; Delete "bum-in mode" Enter --burn-in mode--.
Column 9, Claim 7, Line 55; Delete "bum-in mode" Enter --burn-in mode--.
Column 10, Claim 11, Line 10; Delete "bum-in mode" Enter --burn-in mode--.
Column 10, Claim 12, Line 20; Delete "bum-in mode" Enter --burn-in mode--.
Column 10, Claim 17, Line 43; Delete "bum-in mode" Enter --burn-in mode--.
Column 10, Claim 17, Line 45: Delete "bum-in mode" Enter --burn-in mode--.

Signed and Sealed this

Fourth Day of March, 2008

JON W. DUDAS
*Director of the United States Patent and Trademark Office*